(12) United States Patent
Kim et al.

(10) Patent No.: US 11,257,885 B2
(45) Date of Patent: Feb. 22, 2022

(54) ORGANIC LIGHT EMITTING DISPLAY DEVICE AND METHOD OF MANUFACTURING ORGANIC LIGHT EMITTING DISPLAY DEVICE

(71) Applicant: Samsung Display Co., Ltd., Yongin-Si (KR)

(72) Inventors: Jaybum Kim, Seoul (KR); Myounghwa Kim, Seoul (KR); Kyoung Seok Son, Seoul (KR); Seungjun Lee, Suwon-si (KR); Seunghun Lee, Seoul (KR); Jun Hyung Lim, Seoul (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/581,041

(22) Filed: Sep. 24, 2019

(65) Prior Publication Data

US 2020/0119117 A1  Apr. 16, 2020

(30) Foreign Application Priority Data

Oct. 10, 2018  (KR) .................. 10-2018-0120701

(51) Int. Cl.
*H01L 27/32* (2006.01)
*H01L 51/56* (2006.01)

(52) U.S. Cl.
CPC ...... *H01L 27/3262* (2013.01); *H01L 27/3258* (2013.01); *H01L 51/56* (2013.01)

(58) Field of Classification Search
CPC .................... H01L 27/3262; H01L 27/3258
See application file for complete search history.

(56) References Cited

U.S. PATENT DOCUMENTS

| | | | |
|---|---|---|---|
| 9,543,370 B2 | 1/2017 | Tsai et al. | |
| 2007/0120471 A1* | 5/2007 | Yamazaki | H01L 27/12 313/506 |
| 2015/0171115 A1* | 6/2015 | Yamazaki | H01L 21/76816 257/43 |
| 2017/0236943 A1* | 8/2017 | Yamazaki | H01L 29/78618 257/43 |
| 2018/0122835 A1 | 5/2018 | Watakabe et al. | |
| 2018/0286888 A1* | 10/2018 | Yamaguchi | H01L 29/78675 |

FOREIGN PATENT DOCUMENTS

| | | |
|---|---|---|
| JP | 2007-286150 A | 11/2007 |
| KR | 10-2007-0072207 A | 7/2007 |
| KR | 10-2018-0005580 A | 1/2018 |

* cited by examiner

*Primary Examiner* — Trang Q Tran
(74) *Attorney, Agent, or Firm* — Innovation Counsel LLP

(57) ABSTRACT

An organic light emitting display device includes a substrate, a first semiconductor element, a second semiconductor element, a protection electrode, and a light emitting structure. The protection electrode is disposed between the second active layer and the second source electrode and the second drain electrode, and has an opening that exposes a portion of the second active layer and the light emitting structure is disposed on the first and second semiconductor elements.

15 Claims, 12 Drawing Sheets

ORGANIC LIGHT EMITTING DISPLAY DEVICE AND METHOD OF MANUFACTURING ORGANIC LIGHT EMITTING DISPLAY DEVICE

CROSS-REFERENCE TO RELATED APPLICATION(S)

This application claims priority under 35 USC § 119 to Korean Patent Applications No. 10-2018-0120701, filed on Oct. 10, 2018 in the Korean Intellectual Property Office (KIPO), the contents of which are incorporated herein in its entirety by reference.

BACKGROUND

1. Field

Example embodiments relate generally to an organic light emitting display device and a method of manufacturing an organic light emitting display device. More particularly, embodiments of the present inventive concept relate to an organic light emitting display device including a silicon-based semiconductor element and a metal oxide-based semiconductor element and a method of manufacturing an organic light emitting display device including a silicon-based semiconductor element and a metal oxide-based semiconductor element.

2. Description of the Related Art

A flat panel display ("FPD") device is widely used as a display device of an electronic device because the FPD device is lightweight and thin compared to a cathode-ray tube ("CRT") display device. Typical examples of the FPD device are a liquid crystal display ("LCD") device and an organic light emitting display ("OLED") device.

Recently, the OLED device that simultaneously (or concurrently) includes a silicon-based semiconductor element and a metal oxide-based semiconductor element may have been developed. In a process for forming the silicon-based semiconductor element and the metal oxide-based semiconductor element, a heat treatment process may be performed after a contact hole of the silicon-based semiconductor element is formed. When the heat treatment process is performed, a portion of a silicon semiconductor layer included in the silicon-based semiconductor element may be exposed to an outside through the contact hole. The exposed surface of the silicon semiconductor layer may react with oxygen ions existing in a chamber, such that oxides may be formed on the exposed surface. To remove the oxides, a buffered oxide etchant ("BOE") process may be performed. When the BOE process is performed, a metal oxide semiconductor layer included in the metal oxide semiconductor element may be damaged by the etchant used in the BOE process. As result, a defect of the metal oxide-based semiconductor element may occur.

SUMMARY

Some example embodiments provide an organic light emitting display (OLED) device including a silicon-based semiconductor element and a metal oxide-based semiconductor element.

Some example embodiments provide a method of manufacturing an OLED device including a silicon-based semiconductor element and a metal oxide-based semiconductor element.

According to some example embodiments, an OLED device includes a substrate, a first semiconductor element, a second semiconductor element, a protection electrode, and a light emitting structure. The substrate has a first region and a second region that is adjacent to the first region. The first semiconductor element includes a first active layer disposed in the first region on the substrate, a first gate electrode disposed on the first active layer, and a first source electrode and a first drain electrode disposed on the first gate electrode. The second semiconductor element includes a second gate electrode disposed in the second region on the substrate, a second active layer disposed on the second gate electrode, and a second source electrode and a second drain electrode disposed on the second active layer. The protection electrode is disposed between the second active layer and the second source electrode and the second drain electrode, and has an opening that exposes a portion of the second active layer, and the light emitting structure is disposed on the first semiconductor element and the second semiconductor element.

In example embodiments, the second active layer may be located to overlap the first source electrode, the first drain electrode, the second source electrode and the second drain electrode.

In example embodiments, the second active layer may be disposed under the protection electrode to overlap a portion of the protection electrode.

In example embodiments, the protection electrode may be in contact with a lower surface of the first source electrode and a lower surface of the second drain electrode, and is disposed in a space disposed between the first source electrode and the second drain electrode. The protection electrode may electrically connect the first source electrode and the second drain electrode.

In example embodiments, the second active layer might not be disposed in a space disposed between the first source electrode and the first drain electrode, and may be disposed in a space disposed between the first source electrode and the second drain electrode and in a space disposed between the second source electrode and the second drain electrode.

In example embodiments, the protection electrode might not be disposed in both a space disposed between the first source electrode and the first drain electrode and a space disposed between the second source electrode and the second drain electrode, and a space disposed between the second source electrode and the second drain electrode corresponds to the opening of the protection electrode.

In example embodiments, the first semiconductor element may have a top gate structure, and may include a silicon-based semiconductor. The second semiconductor element may have a bottom gate structure and may include a metal oxide-based semiconductor.

In example embodiments, the first active layer of the first semiconductor element may include amorphous silicon or poly silicon.

In example embodiments, the OLED device may further include a gate electrode pattern disposed on the first gate electrode, and the gate electrode pattern and the second gate electrode may be located on a same layer.

In example embodiments, the OLED device may further include a gate insulation layer covering the first active layer in the first region on the substrate, a first insulating interlayer covering the first gate electrode in the first region on the gate insulation layer, a second insulating interlayer covering the second gate electrode in the second region on the first insulating interlayer, and a protecting insulation layer covering the first source electrode, the first drain electrode, the second source electrode and the second drain electrode on the second insulating interlayer. The protecting insulating layer may have an opening that exposes a portion of the first drain electrode.

In example embodiments, the protective insulation layer may be in contact with an upper surface of the second active layer and side walls of the protection electrode in a space disposed between the second source electrode and the second drain electrode.

In example embodiments, the protective insulation layer may be in contact with an upper surface of the second insulating interlayer, side walls of the second active layer, and side walls of the protection electrode in a space disposed between the first source electrode and the first drain electrode.

In example embodiments, the second insulating interlayer may be in contact with a lower surface of the second active layer, and the second insulating interlayer and the protective insulation layer may include silicon oxide.

In example embodiments, the light emitting structure may include a lower electrode disposed on the first semiconductor element and the second semiconductor element, a light emitting layer disposed on the lower electrode, and an upper electrode disposed on the light emitting layer.

In example embodiments, the OLED device may further include a planarization layer disposed between the protective insulation layer and the lower electrode. The planarization layer may include organic materials, and the planarization layer may have a contact hole exposing an upper surface of the first drain electrode exposed by the opening of the protective insulation layer. The lower electrode may be connected to the first drain electrode through the contact hole of the planarization layer.

According to some example embodiments, a method of manufacturing an OLED device is provided as follows. A substrate having a first region and a second region that is adjacent to the first region is provided. A first active layer having a source region and a drain region, a first gate electrode and a gate insulation layer disposed between the first active layer and the first gate electrode are formed in the first region on the substrate. A gate electrode pattern in the first region on the substrate and a second gate electrode is formed in the second region on the substrate. An insulating interlayer is formed on the second gate electrode and the gate electrode pattern. A preliminary second active layer is formed on the insulating interlayer. A preliminary protection electrode layer is formed on the preliminary second active layer. A first contact hole and a second contact hole exposing each of the source region and the drain region of the first active layer are formed by removing a first portion and a second portion of the preliminary protection electrode layer, the preliminary second active layer, and the insulating interlayer. A preliminary electrode layer is formed on the preliminary protection electrode layer. A first source electrode and a first drain electrode in the first region and a second active layer, a protection electrode and a second source electrode and a second drain electrode in the second region are formed on the insulating interlayer by selectively etching the preliminary electrode layer, the preliminary protection electrode layer, and the preliminary second active layer.

In example embodiments, when the preliminary second active layer, the preliminary protection electrode layer and the preliminary electrode layer are selectively etched, a portion of the preliminary protection electrode layer may be removed in the second region, and an upper surface of the preliminary second active layer may be exposed.

In example embodiments, the method may further include performing a heat treatment process on the preliminary second active layer, the first contact hole and the second contact hole, and the first active layer after forming the first contact hole and the second contact hole and performing a buffered oxide etchant ("BOE") process that removes an oxide layer of the first contact hole and the second contact hole after the heat treatment process.

In example embodiments, when the BOE process is performed, the preliminary second active layer may be protected by the preliminary protection electrode layer.

In example embodiments, the method may further include forming a protective insulation layer covering the first source electrode, the first drain electrode, the second source electrode, and the second drain electrode on the insulating interlayer, and the protective insulation layer may be in direct contact with an upper surface of the second active layer and side walls of the protection electrode in the second region.

The OLED device in accordance with example embodiments includes the protection electrode, the OLED device may protect the second active layer from the etchant used in the BOE process. Accordingly, the OLED device may prevent a defect of the second semiconductor element.

In addition, as the second insulating interlayer and the protective insulation layer that include SiOx are in direct contact with the second active layer, interface characteristics of the second active layer may be relatively increased. Accordingly, the OLED device according to example embodiments may include the second semiconductor element where reliability is increased.

In a method of manufacturing the OLED device in accordance with example embodiments, when the heat treatment process is performed on the first active layer and the preliminary second active layer, a driving-range of the first semiconductor element that corresponds to a driving transistor may be relatively widened, and the second semiconductor element that is relatively precise may be obtained because a scattering of a threshold voltage of the second semiconductor element that corresponds to a switching transistor is reduced. In addition, as the heat treatment process is simultaneously performed on the first active layer and the preliminary second active layer, a manufacturing cost of the OLED device may be relatively decreased.

In addition, since the preliminary protection electrode layer completely cover the preliminary second active layer, the preliminary protection electrode layer may protect the preliminary second active layer from the etchant used in the BOE process. Accordingly, after the preliminary second active layer is formed, the BOE process may be performed without a damage of the preliminary second active layer.

BRIEF DESCRIPTION OF THE DRAWINGS

Example embodiments can be understood in more detail from the following description taken in conjunction with the accompanying drawings, in which.

DETAILED DESCRIPTION OF THE EMBODIMENTS

Hereinafter, embodiments of the present inventive concept will be explained in detail with reference to the accompanying drawings.

Figure 1:
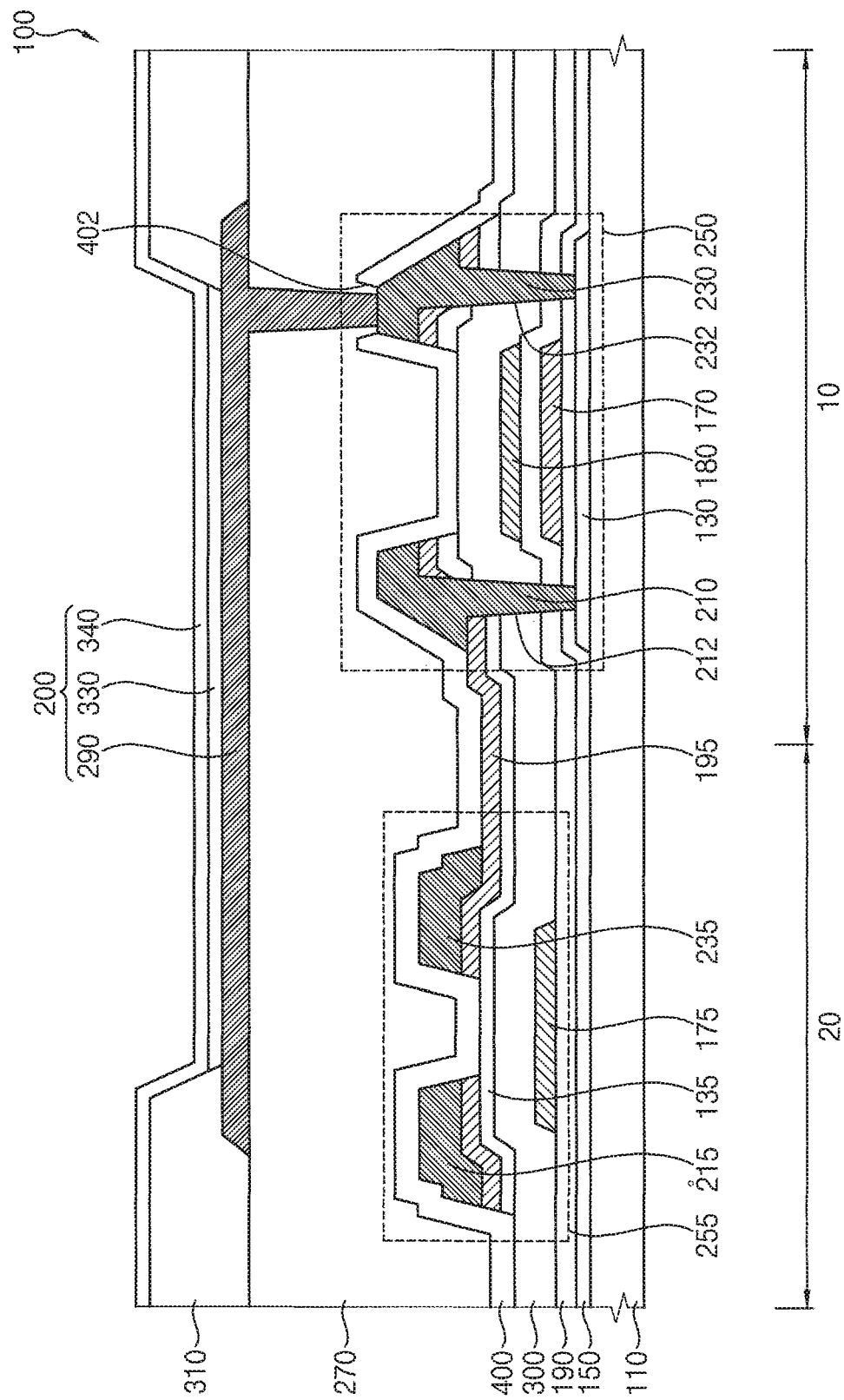
FIG. 1 is a cross-sectional view illustrating an organic light emitting display (OLED) device in accordance with example embodiments.

FIG. 1 is a cross-sectional view illustrating an organic light emitting display (OLED) device in accordance with example embodiments.

Referring to FIG. 1, an OLED device 100 may include a substrate 110, a first semiconductor element 250, a second semiconductor element 255, a gate electrode pattern 180, a gate insulation layer 150, a first insulating interlayer 190, a second insulating interlayer 300, a protection electrode 195, a protective insulation layer 400, a planarization layer 270, a light emitting structure 200, a pixel defining layer 310, etc. Here, the first semiconductor element 250 may include a first active layer 130, a first gate electrode 170, a first source electrode 210, and a first drain electrode 230, and the second semiconductor element 255 may include a second active layer 135, a second gate electrode 175, a second source electrode 215, and a second drain electrode 235. In addition, the light emitting structure 200 may include a lower electrode 290, a light emitting layer 330, and an upper electrode 340.

As the OLED device 100 includes the protection electrode 195, the OLED device 100 may prevent the second active layer 135 from damaging by an etchant used in a buffered oxide etchant ("BOE") process.

The substrate 110 including transparent or opaque materials may be provided. For example, the substrate 110 may include a quartz substrate, a synthetic quartz substrate, a calcium fluoride substrate, a fluoride-doped quartz substrate, a sodalime glass substrate, a non-alkali glass substrate etc. Alternatively, the substrate 110 may include a flexible transparent material such as a flexible transparent resin substrate, e.g., a polyimide substrate. In this case, the polyimide substrate may include a first polyimide layer, a barrier film layer, a second polyimide layer, etc. For example, the polyimide substrate may have a configuration where the first polyimide layer, the barrier film layer, and the second polyimide layer are stack on a rigid glass substrate. Since the polyimide substrate is relatively thin and flexible, the polyimide substrate may be formed on a rigid glass substrate to help support the formation of an upper structure, e.g., the first semiconductor element 250, the second semiconductor element 255, the light emitting structure 200, etc. In a manufacturing the OLED device 100, after an insulation layer, e.g., a buffer layer, is provided on the second polyimide layer of the polyimide substrate, the upper structure may be formed on the insulation layer. After the upper structure is formed on the buffer layer, the rigid glass substrate on which the polyimide substrate is formed may be removed. It may be difficult to directly form the upper structure on the polyimide substrate because the polyimide substrate is relatively thin and flexible. Accordingly, the upper structure is formed on the polyimide substrate and the rigid glass substrate, and then the polyimide substrate may serve as the substrate 110 after the removal of the rigid glass substrate.

In example embodiments, the substrate 110 may have a first region 10 and a second region 20, and the first region 10 may be located adjacent to the second region 20. For example, the first region 10 may be a region where a driving transistor is disposed, and the second region 20 may be a region where a switching transistor is disposed.

A buffer layer (not shown) may be disposed on the substrate 110. The buffer layer may be disposed on the entire substrate 110. The buffer layer may prevent the diffusion of metal atoms and/or impurities from the substrate 110 into the first semiconductor element 250, the second semiconductor element 255, and the light emitting structure 200. In addition, the buffer layer may control a rate of a heat transfer in a crystallization process for forming an active layer, thereby obtaining a substantially uniform active layer. Further, the buffer layer may improve a surface flatness of the substrate 110 when a surface of the substrate 110 is relatively irregular. According to a type of the substrate 110, at least two buffer layers may be provided on the substrate 110, or the buffer layer might not be disposed. For example, the buffer layer may include organic materials or inorganic materials.

The first active layer 130 may be disposed in the first region 10 on the substrate 110. For example, the first active layer 130 may include a metal oxide semiconductor, amorphous silicon, polysilicon, an organic semiconductor, etc. In example embodiments, the first active layer 130 may include a silicon-based semiconductor, and may include amorphous silicon or polysilicon. In addition, the first active layer 130 may include a source region, a drain region, and a channel region that is located between the source region and the drain region. For example, a contact hole 212 may expose the source region, and a contact hole 232 may expose the drain region.

The gate insulation layer 150 may be disposed in the first region 10 and the second region 20 on the substrate 110 and the first active layer 130. The gate insulation layer 150 may cover the first active layer 130 in the first region 10 on the substrate 110, and may be disposed on the entire substrate 110. For example, the gate insulation layer 150 may cover the first active layer 130 on the substrate 110, and may be disposed as a substantially uniform thickness along a profile of the first active layer 130. Alternatively, the gate insulation layer 150 may sufficiently cover the first active layer 130 on the substrate 110, and may have a substantially flat upper surface without a step around the first active layer 130. The gate insulation layer 150 may include silicon compound, metal oxide, etc. For example, the gate insulation layer 150 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc. Alternatively, the gate insulation layer 150 may have a multi-layered structure including a plurality of insulation layers. For example, the insulation layers may have different thicknesses to each other or include different materials to each other.

The first gate electrode 170 may be disposed in the first region 10 on the gate insulation layer 150. The first gate electrode 170 may be disposed on a portion of the gate insulation layer 150 under which the first active layer 130 is located. In other words, the first gate electrode 170 may be located to overlap the channel region of the first active layer 130. The first gate electrode 170 may include a metal, a metal alloy, metal nitride, conductive metal oxide, transparent conductive materials, etc. These may be used alone or in a suitable combination thereof. Alternatively, the first gate electrode 170 may have a multi-layered structure including a plurality of layers.

The first insulating interlayer 190 may be disposed in the first and second regions 10 and 20 on the gate insulation layer 150 and the first gate electrode 170. The first insulating interlayer 190 may cover the first gate electrode 170 in the first region 10 on the gate insulation layer 150, and may be disposed on the entire gate insulation layer 150. For example, the first insulating interlayer 190 may cover the first gate electrode 170 on the gate insulation layer 150, and may be disposed as a substantially uniform thickness along a profile of the first gate electrode 170. Alternatively, the first insulating interlayer 190 may sufficiently cover the first gate electrode 170 on the gate insulation layer 150, and may have a substantially flat upper surface without a step around the first gate electrode 170. The first insulating interlayer 190 may include silicon compound, metal oxide, etc. Alternatively, the first insulating interlayer 190 may have a multi-layered structure including a plurality of insulation layers. For example, the insulation layers may have different thicknesses to each other or include different materials to each other.

The gate electrode pattern 180 may be disposed in the first region 10 on the first insulating interlayer 190. The gate electrode pattern 180 may be disposed on a portion of the first insulating interlayer 190 under which the first gate electrode 170 is located. The gate electrode pattern 180 may serve as a wiring. For example, the gate electrode pattern 180 may be data signal wirings providing a data signal, gate signal wirings providing a gate signal, initialization signal wirings providing an initialization signal, light emission signal wirings providing a light emission signal, power supply wirings providing a power supply voltage, etc. The gate electrode pattern 180 may include a metal, an alloy of a metal, metal nitride, conductive metal oxide, transparent conductive materials, etc. These may be used alone or in a suitable combination thereof. Alternatively, the gate electrode pattern 180 may have a multi-layered structure including a plurality of layers. In some example embodiments, the gate electrode pattern 180 may serve as an electrode. In this case, a wiring may be further disposed on the gate electrode pattern 180, and the wiring may be connected to the gate electrode pattern 180 via a contact hole.

The second gate electrode 175 may be disposed in the second region 20 on the first insulating interlayer 190. In example embodiments, the second gate electrode 175 and the gate electrode pattern 180 may be located on a same layer, and may be simultaneously (or concurrently) formed using same materials. The second gate electrode 175 may include a metal, an alloy of a metal, metal nitride, conductive metal oxide, transparent conductive materials, etc. These may be used alone or in a suitable combination thereof. Alternatively, the second gate electrode 175 may have a multi-layered structure including a plurality of layers.

The second insulating interlayer 300 may be disposed on the first insulating interlayer 190, the second gate electrode 175, and the gate electrode pattern 180. The second insulating interlayer 300 may cover the gate electrode pattern 180 in the first region 10 on the first insulating interlayer 190 and cover the second gate electrode 175 in the second region 20 on the first insulating interlayer 190, and may be disposed on the entire first insulating interlayer 190. For example, the second insulating interlayer 300 may cover the gate electrode pattern 180 and the second gate electrode 175 on the first insulating interlayer 190, and may be disposed as a substantially uniform thickness along a profile of the gate electrode pattern 180 and the second gate electrode 175. Alternatively, the second insulating interlayer 300 may sufficiently cover the gate electrode pattern 180 and the second gate electrode 175 on the first insulating interlayer 190, and may have a substantially flat upper surface without a step around the gate electrode pattern 180 and the second gate electrode 175. The second insulating interlayer 300 may include silicon compound, metal oxide, etc. Alternatively, the second insulating interlayer 300 may have a multi-layered structure including a plurality of insulation layers. For example, the insulation layers may have different thicknesses to each other or include different materials to each other.

In example embodiments, the second insulating interlayer 300 may be in direct contact with the second active layer 135 so as to secure characteristics or reliability of the second semiconductor element 255. In other words, an upper surface of the second insulating interlayer 300 may be in direct contact with a lower surface of the second active layer 135. For example, when the second active layer 135 including a metal oxide semiconductor is in direct contact with the second insulating interlayer 300 including SiOx, interface characteristics of the second active layer 135 may be relatively improved.

The second active layer 135 may be disposed in the second region 20 on the second insulating interlayer 300. The second active layer 135 may be disposed on a portion of the second insulating interlayer 300 under which the second gate electrode 175 is located. In addition, the second active layer 135 may extend in a first direction D1 that is a direction from the second region 20 into the first region 10 on the second insulating interlayer 300. In example embodiments, the second active layer 135 may be located to overlap the protection electrode 195, the first source electrode 210, the first drain electrode 230, the second source electrode 215, and the second drain electrode 235, and may not be located on the contact hole 212 and the contact hole 232. In addition, the second active layer 135 may be disposed in a space between the second source electrode 215 and the second drain electrode 235, and might not be disposed in a space between the first source electrode 210 and the first drain electrode 230. Further, the second active layer 135 may be disposed in a space between the second drain electrode 235 and the first source electrode 210. The second active layer 135 may include a metal oxide semiconductor. In other words, the second active layer 135 may include a metal oxide semiconductor layer including at least one of two-component compound (ABx), ternary compound (ABxCy), four-component compound (ABxCyDz), etc. These compounds contain indium (In), zinc (Zn), gallium (Ga), tin (Sn), titanium (Ti), aluminum (Al), hafnium (Hf), zirconium (Zr), magnesium (Mg), etc. For example, the second active layer 135 may include at least one of zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), etc.

The protection electrode 195 may be disposed on the second active layer 135 except regions overlapping with channel regions of the first semiconductor element 250 and the second semiconductor element 255. The protection electrode 195 may be disposed in the second region 20 on the second active layer 135. The protection electrode 195 may be disposed between the second active layer 135 and the second source and second drain electrodes 215 and 235. In addition, the protection electrode 195 may have a first opening exposing an upper surface of the second active layer 135 in the second region 20 and a second opening exposing an upper surface of the second insulating interlayer 300 in the first region 10. Further, the protection electrode 195 may extend in the first direction D1 on the second active layer 135. In example embodiments, the protection electrode 195 may be located to overlap the second active layer 135, the first source electrode 210, the first drain electrode 230, the second source electrode 215, and the second drain electrode 235, and may not be located on the contact hole 212 and the contact hole 232. In addition, the protection electrode 195 might not be disposed in a space between the second source electrode 215 and the second drain electrode 235, and might not be disposed in a space between the first source electrode 210 and the first drain electrode 230. Here, the space between the second source electrode 215 and the second drain electrode 235 may correspond to the first opening, and the space between the first source electrode 210 and the first drain electrode 230 may be correspond to the second opening. Further, the protection electrode 195 may be disposed in a space between the second drain electrode 235 and the first source electrode 210. For example, the protection electrode 195 may be in contact with a lower surface of the first source electrode 210 and a lower surface of the second drain electrode 235, and may electrically connect the first source electrode 210 and the second drain electrode 235.

The protection electrode 195 may include a metal, an alloy of a metal, metal nitride, conductive metal oxide, transparent conductive materials, etc. For example, the protection electrode 195 may include gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an alloy of aluminum, aluminum nitride (AlNx), an alloy of silver, tungsten nitride (WNx), an alloy of copper, an alloy of molybdenum, titanium nitride (TiNx), chromium nitride (CrNx), tantalum nitride (TaNx), strontium ruthenium oxide (SRO), zinc oxide (ZnOx), indium tin oxide (ITO), stannum oxide (SnOx), indium oxide (InOx), gallium oxide (GaOx), indium zinc oxide (IZO), etc. These may be used alone or in a suitable combination thereof. Alternatively, the protection electrode 195 may have a multi-layered structure including a plurality of layers.

For example, in a manufacturing process of the OLED device 100, the protection electrode 195 may include materials that are not etched by a buffered oxide etchant (BOE) so as to protect the second active layer 135 from the buffered oxide etchant. In example embodiments, the protection electrode 195 may include Mo or Cu.

The first source electrode 210 and the first drain electrode 230 may be disposed in the first region 10 on the protection electrode 195. The first source electrode 210 may be in contact with the source region of the first active layer 130 via the first contact hole 212 formed by removing a first portion of the second active layer 135, the protection electrode 195, the second insulating interlayer 300, the first insulating interlayer 190, and the gate insulation layer 150. The first drain electrode 230 may be in contact with the drain region of the first active layer 130 via the second contact hole 232 formed by removing a second portion of the second active layer 135, the protection electrode 195, the second insulating interlayer 300, the first insulating interlayer 190, and the gate insulation layer 150. Each of the first source electrode 210 and the first drain electrode 230 may include a metal, an alloy, metal nitride, conductive metal oxide, transparent conductive materials, etc. These may be used alone or in a suitable combination thereof. Alternatively, each of the first source electrode 210 and the first drain electrode 230 may have a multi-layered structure including a plurality of layers.

Accordingly, the first semiconductor element 250 including the first active layer 130, the first gate electrode 170, the first source electrode 210, and the first drain electrode 230 may be disposed on the substrate 110. Here, the first semiconductor element 250 may serve as a driving transistor having a silicon-based semiconductor. In addition, the first semiconductor element 250 may serve as a transistor having a top gate structure.

The second source electrode 215 and the second drain electrode 235 may be disposed in the second region 20 on the second insulating interlayer 300. The second source electrode 215 may overlap a first lateral portion of the second gate electrode 175, and may be disposed on the protection electrode 195. The second drain electrode 235 may overlap a second lateral portion of the second gate electrode 175, and may be disposed on the protection electrode 195. Here, the first lateral portion may opposite to the second lateral portion. In other words, the second source and second drain electrodes 215 and 235 may be disposed to overlap both lateral portions of the second gate electrode 175 on the protection electrode 195, and may expose (or might not be disposed in) a portion of an upper surface of the second active layer 135. Each of the second source and second drain electrodes 215 and 235 may include a metal, an alloy, metal nitride, conductive metal oxide, transparent conductive materials, etc. These may be used alone or in a suitable combination thereof. In example embodiments, each of the first source and first drain electrodes 210 and 230 and the second source and second drain electrodes 215 and 235 may be located on a same layer, and may be simultaneously formed using same materials. Alternatively, each of the second source and second drain electrodes 215 and 235 may have a multi-layered structure including a plurality of layers.

Accordingly, the second semiconductor element 255 including the second active layer 135, the second gate electrode 175, the second source electrode 215, and the second drain electrode 235 may be disposed on the substrate 110. Here, the second semiconductor element 255 may serve as a switching transistor including an oxide-based semiconductor. In addition, the second semiconductor element 255 may serve as a transistor having a bottom gate structure.

In example embodiments, the OLED device 100 includes two transistors, e.g., the first semiconductor element 250 and the second semiconductor element 255, but not being limited thereto. For example, the OLED device 100 may include at least three transistors and at least one capacitor.

The protective insulation layer 400 may be disposed on the second insulating interlayer 300, the first source and first drain electrodes 210 and 230, and the second source and second drain electrodes 215 and 235. The protective insulation layer 400 may cover the first source and first drain electrodes 210 and 230 in the first region 10 and the second source and second drain electrodes 215 and 235 in the second region 20 on the second insulating interlayer 300, and may be disposed on the entire second insulating interlayer 300. For example, the protective insulation layer 400 may cover the first source and first drain electrodes 210 and 230 and the second source and second drain electrodes 215 and 235 on the second insulating interlayer 300, and may be disposed as a substantially uniform thickness along a profile of the first source and first drain electrodes 210 and 230 and the second source and second drain electrodes 215 and 235. Alternatively, the protective insulation layer 400 may sufficiently cover the first source and first drain electrodes 210 and 230 and the second source and second drain electrodes 215 and 235 on the second insulating interlayer 300, and may have a substantially flat upper surface without a step around the first source and first drain electrodes 210 and 230 and the second source and second drain electrodes 215 and 235. In example embodiments, the protective insulation layer 400 may have an opening 402 exposing a portion of an upper surface of the first drain electrode 230 in the first region 10. The lower electrode 290 may be in contact with the first drain electrode 230 through the opening 402 and a contact hole of the planarization layer 270. The protective insulation layer 400 may include silicon compound, metal oxide, etc. In example embodiments, the protective insulation layer 400 may include SiOx. In addition, the protective insulation layer 400 may be in direct contact with an upper surface of the second active layer 135 and side walls of the protection electrode 195 in a space (e.g., the first opening of the protection electrode 195) disposed between the second source electrode 215 and the second drain electrode 235. As the protective insulation layer 400 including SiOx is in direct contact with the second active layer 135, interface characteristics of the second active layer 135 may be relatively improved. Further, the protective insulation layer 400 which is disposed in a space (e.g., the second opening of the protection electrode 195) disposed between the first source electrode 210 and the first drain electrode 230 may be in direct contact with an upper surface of the second insulating interlayer 300, side walls of the second active layer 135, and side walls of the protection electrode 195. Alternatively, the protective insulation layer 400 may have a multi-layered structure including a plurality of insulation layers. For example, the insulation layers may have different thicknesses to each other or include different materials to each other.

The planarization layer 270 may be disposed on the protective insulation layer 400. The planarization layer 270 may be disposed on the entire protective insulation layer 400. For example, the planarization layer 270 may have a thickness enough to sufficiently cover the protective insulation layer 400. In this case, the planarization layer 270 may have a substantially flat upper surface. A planarization process may be further performed on the planarization layer 270 to implement the flat upper surface when the upper surface of the substrate 110 is not sufficiently flat. The portion of the upper surface of the first drain electrode 230 may be exposed via a contact hole formed by removing a portion of the planarization layer 270. The planarization layer 270 may include organic materials or inorganic materials. In example embodiments, the planarization layer 270 may include organic materials such as polyimide, epoxy-based resin, acryl-based resin, polyester, photoresist, polyacryl-based resin, polyimide-based resin, a polyamide-based resin, a siloxane-based resin, etc. For example, since the protective insulation layer 400 includes inorganic materials and the planarization layer 270 includes organic materials, the protective insulation layer 400 might not be removed in an etching process for forming the contact hole of the planarization layer 270. Thus, to expose the portion of the upper surface of the first drain electrode 230, the contact hole of the planarization layer 270 may be formed after the opening 402 of the protective insulation layer 400 is formed.

The lower electrode 290 may be disposed on the planarization layer 270. The lower electrode 290 may be in direct contact with the first drain electrode 230 via the contact hole formed in the planarization layer 270, and may be electrically connected to the first semiconductor element 250. The lower electrode 290 may include a metal, a metal alloy, metal nitride, conductive metal oxide, transparent conductive materials, etc. These may be used alone or in a suitable combination thereof. Alternatively, the lower electrode 290 may have a multi-layered structure including a plurality of layers.

The pixel defining layer 310 may be disposed on a portion of the lower electrode 290 and the planarization layer 270. The pixel defining layer 310 may cover entire edges of the lower electrode 290 including both lateral portions of the lower electrode 290, and may expose a portion of an upper surface of the lower electrode 290. The pixel defining layer 310 may include organic materials or inorganic materials. In example embodiments, the pixel defining layer 310 may include organic materials.

The light emitting layer 330 may be disposed on the lower electrode 290 exposed by the pixel defining layer 310. The light emitting layer 330 may be formed using at least one of light emitting materials capable of generating different colors of light, e.g., a red color of light, a blue color of light, and a green color of light, etc., according to sub-pixels. Alternatively, the light emitting layer 330 may generally generate a white color of light by stacking a plurality of light emitting materials capable of generating different colors of light such as a red color of light, a green color of light, a blue color of light, etc. In this case, a color filter may be disposed on the light emitting layer 330, e.g., to overlap the light emitting layer 330 on a lower surface of an encapsulation substrate (not shown). The color filter may include at least one selected from a red color filter, a green color filter, and a blue color filter. Alternatively, the color filter may include a yellow color filter, a cyan color filter, and a magenta color filter. The color filter may include a photosensitive resin, a color photoresist, etc.

The upper electrode 340 may be disposed on the pixel defining layer 310 and the light emitting layer 330. The upper electrode 340 may cover the light emitting layer 330 and the pixel defining layer 310, and may be entirely disposed on the light emitting layer 330 and the pixel defining layer 310. The upper electrode 340 may include a metal, a metal alloy, metal nitride, conductive metal oxide, transparent conductive materials, etc. These may be used alone or in a suitable combination thereof. Alternatively, the upper electrode 340 may have a multi-layered structure including a plurality of layers.

Accordingly, the light emitting structure 200 including the lower electrode 290, the light emitting layer 330, and the upper electrode 340 may be disposed on the planarization layer 270.

An encapsulation substrate (not shown) may be disposed on the upper electrode 340. The encapsulation substrate and the substrate 110 may include substantially the same materials. For example, the encapsulation substrate may include a quartz substrate, a synthetic quartz substrate, a calcium fluoride substrate, a fluoride-doped quartz substrate, a sodalime glass substrate, a non-alkali glass substrate, etc. In some example embodiments, the encapsulation substrate may include a transparent inorganic material or flexible plastic. For example, the encapsulation substrate may include a flexible transparent resin substrate. In this case, to increase flexibility of the OLED device 100, the encapsulation substrate may have a stacked structure where at least one inorganic layer and at least one organic layer are alternately stacked. The stack structure may include a first inorganic layer, an organic layer, and a second inorganic layer. For example, the first inorganic layer having flexibility may be disposed along a profile of the upper electrode 340, and the organic layer having flexibility may be disposed on the first inorganic layer. The second inorganic layer having flexibility may be disposed on the organic layer. That is, the stack structure may correspond to a thin film encapsulation structure that is in direct contact with the upper electrode 340. Accordingly, the OLED device 100 may be provided.

As the second insulating interlayer 300 and the protective insulation layer 400 that include SiOx are in direct contact with the second active layer 135, interface characteristics of the second active layer 135 may be relatively increased. Accordingly, the OLED device 100 according to example embodiments may include the second semiconductor element 255 with improved reliability.

In addition, as the OLED device 100 in accordance with example embodiments includes the protection electrode 195, the OLED device 100 may protect the second active layer 135 from damaging by the etchant used in the BOE process. Accordingly, the OLED device 100 may prevent a defect of the second semiconductor element 255.

FIGS. 2 through 10 are cross-sectional views illustrating a method of manufacturing an OLED device in accordance with example embodiments.

Figure 2:
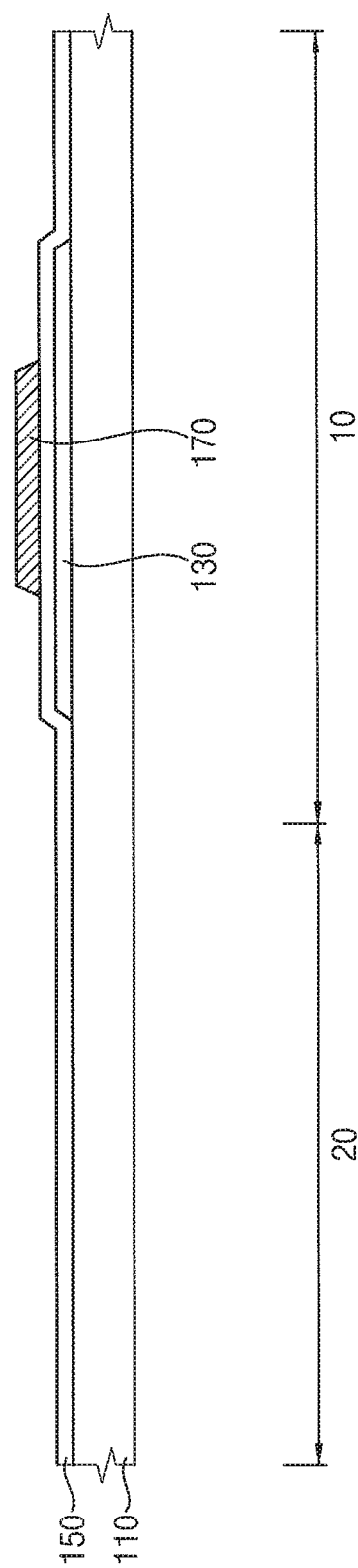
FIGS. 2, 3, 4, 5, 6, 7, 8, 9 and 10 are cross-sectional views illustrating a method of manufacturing an OLED device in accordance with example embodiments.

Referring to FIG. 2, a substrate 110 including transparent or opaque insulation materials may be provided. For example, the substrate 110 may be formed using a quartz substrate, a synthetic quartz substrate, a calcium fluoride substrate, a fluoride-doped quartz substrate, a sodalime glass substrate, a non-alkali glass substrate etc. Alternatively, the substrate 110 may be formed using a flexible transparent material such as a flexible transparent resin substrate (e.g., a polyimide substrate). In example embodiments, the substrate 110 may have a first region 10 and a second region 20, and the first region 10 may be located adjacent to the second region 20.

A buffer layer (not shown) may be formed on the substrate 110. The buffer layer may be formed on the entire substrate 110. The buffer layer may prevent the diffusion of metal atoms and/or impurities from the substrate 110 into a first semiconductor element 250, a second semiconductor element 255 and a light emitting structure 200. In addition, the buffer layer may control a rate of a heat transfer in a crystallization process for forming an active layer, thereby obtaining a substantially uniform active layer. Further, the buffer layer may improve a surface flatness of the substrate 110 when a surface of the substrate 110 is relatively irregular. According to a type of the substrate 110, at least two buffer layers may be provided on the substrate 110, or the buffer layer may not be formed. For example, the buffer layer may be formed using organic materials or inorganic materials.

A first active layer 130 may be formed in the first region 10 on the substrate 110. For example, the first active layer 130 may be formed using a metal oxide semiconductor, amorphous silicon, polysilicon, an organic semiconductor, etc. In example embodiments, the first active layer 130 may include a silicon-based semiconductor, and may include amorphous silicon or polysilicon. In addition, the first active layer 130 may include a source region, a drain region, and a channel region that is located between the source region and the drain region.

A gate insulation layer 150 may be formed in the first region 10 and the second region 20 on the substrate 110 and the first active layer 130. The gate insulation layer 150 may cover the first active layer 130 in the first region 10 on the substrate 110, and may be formed on the entire substrate 110. For example, the gate insulation layer 150 may cover the first active layer 130 on the substrate 110, and may be formed as a substantially uniform thickness along a profile of the first active layer 130. Alternatively, the gate insulation layer 150 may sufficiently cover the first active layer 130 on the substrate 110, and may have a substantially flat upper surface without a step around the first active layer 130. The gate insulation layer 150 may be formed using silicon compound, metal oxide, etc. For example, the gate insulation layer 150 may include SiOx, SiNx, SiOxNy, SiOxCy, SiCxNy, AlOx, AlNx, TaOx, HfOx, ZrOx, TiOx, etc. Alternatively, the gate insulation layer 150 may have a multi-layered structure including a plurality of insulation layers. For example, the insulation layers may have different thicknesses to each other or include different materials to each other.

A first gate electrode 170 may be formed in the first region 10 on the gate insulation layer 150. The first gate electrode 170 may be formed on a portion of the gate insulation layer 150 under which the first active layer 130 is located. In other words, the first gate electrode 170 may be located to overlap the channel region of the first active layer 130. The first gate electrode 170 may be formed using a metal, a metal alloy, metal nitride, conductive metal oxide, transparent conductive materials, etc. These may be used alone or in a suitable combination thereof. Alternatively, the first gate electrode 170 may have a multi-layered structure including a plurality of layers. After forming the first gate electrode 170, a source region and a drain region may be formed by doping the source region and the drain region which do not overlap with the first gate electrode 170 with impurities.

Figure 3:
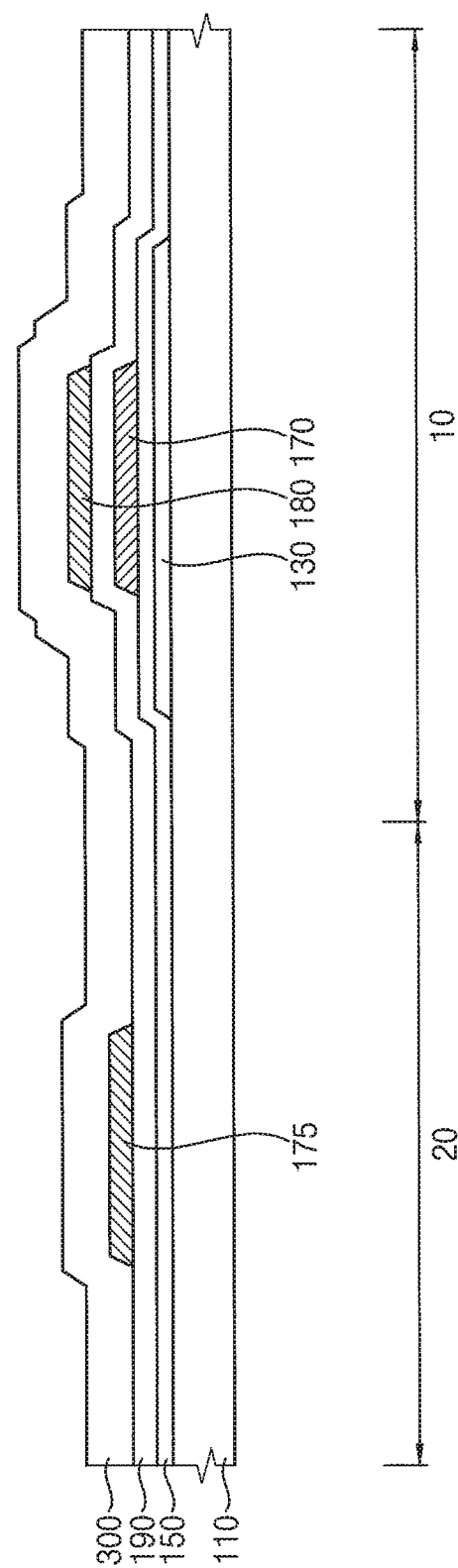

Referring to FIG. 3, a first insulating interlayer 190 may be formed in the first and second regions 10 and 20 on the gate insulation layer 150 and the first gate electrode 170. The first insulating interlayer 190 may cover the first gate electrode 170 in the first region 10 on the gate insulation layer 150, and may be formed on the entire gate insulation layer 150. For example, the first insulating interlayer 190 may cover the first gate electrode 170 on the gate insulation layer 150, and may be formed as a substantially uniform thickness along a profile of the first gate electrode 170. Alternatively, the first insulating interlayer 190 may sufficiently cover the first gate electrode 170 on the gate insulation layer 150, and may have a substantially flat upper surface without a step around the first gate electrode 170. The first insulating interlayer 190 may be formed using silicon compound, metal oxide, etc. Alternatively, the first insulating interlayer 190 may have a multi-layered structure including a plurality of insulation layers. For example, the insulation layers may have different thicknesses to each other or include different materials to each other.

A gate electrode pattern 180 may be formed in the first region 10 on the first insulating interlayer 190. The gate electrode pattern 180 may be formed on a portion of the first insulating interlayer 190 under which the first gate electrode 170 is located. The gate electrode pattern 180 may serve as a wiring. For example, the gate electrode pattern 180 may be data signal wirings providing a data signal, gate signal wirings providing a gate signal, initialization signal wirings providing an initialization signal, light emission signal wirings providing a light emission signal, power supply wirings providing a power supply voltage, etc. The gate electrode pattern 180 may be formed using a metal, an alloy of a metal, metal nitride, conductive metal oxide, transparent conductive materials, etc.

A second gate electrode 175 may be formed in the second region 20 on the first insulating interlayer 190. In example embodiments, the second gate electrode 175 and the gate electrode pattern 180 may be located on a same layer, and may be simultaneously formed using same materials. For example, after a preliminary gate electrode layer is formed on the entire first insulating interlayer 190, the second gate electrode 175 and the gate electrode pattern 180 may be simultaneously formed by selectively removing the preliminary gate electrode layer. The second gate electrode 175 may be formed using a metal, an alloy of a metal, metal nitride, conductive metal oxide, transparent conductive materials, etc.

A second insulating interlayer 300 may be formed on the first insulating interlayer 190, the second gate electrode 175, and the gate electrode pattern 180. The second insulating interlayer 300 may cover the gate electrode pattern 180 in the first region 10 on the first insulating interlayer 190 and cover the second gate electrode 175 in the second region 20 on the first insulating interlayer 190, and may be formed on the entire first insulating interlayer 190. For example, the second insulating interlayer 300 may cover the gate electrode pattern 180 and the second gate electrode 175 on the first insulating interlayer 190, and may be formed as a substantially uniform thickness along a profile of the gate electrode pattern 180 and the second gate electrode 175. Alternatively, the second insulating interlayer 300 may sufficiently cover the gate electrode pattern 180 and the second gate electrode 175 on the first insulating interlayer 190, and may have a substantially flat upper surface without a step around the gate electrode pattern 180 and the second gate electrode 175. The second insulating interlayer 300 may be formed using silicon compound, metal oxide, etc. Alternatively, the second insulating interlayer 300 may have a multi-layered structure including a plurality of insulation layers. For example, the insulation layers may have different thicknesses to each other or include different materials to each other.

Figure 4:
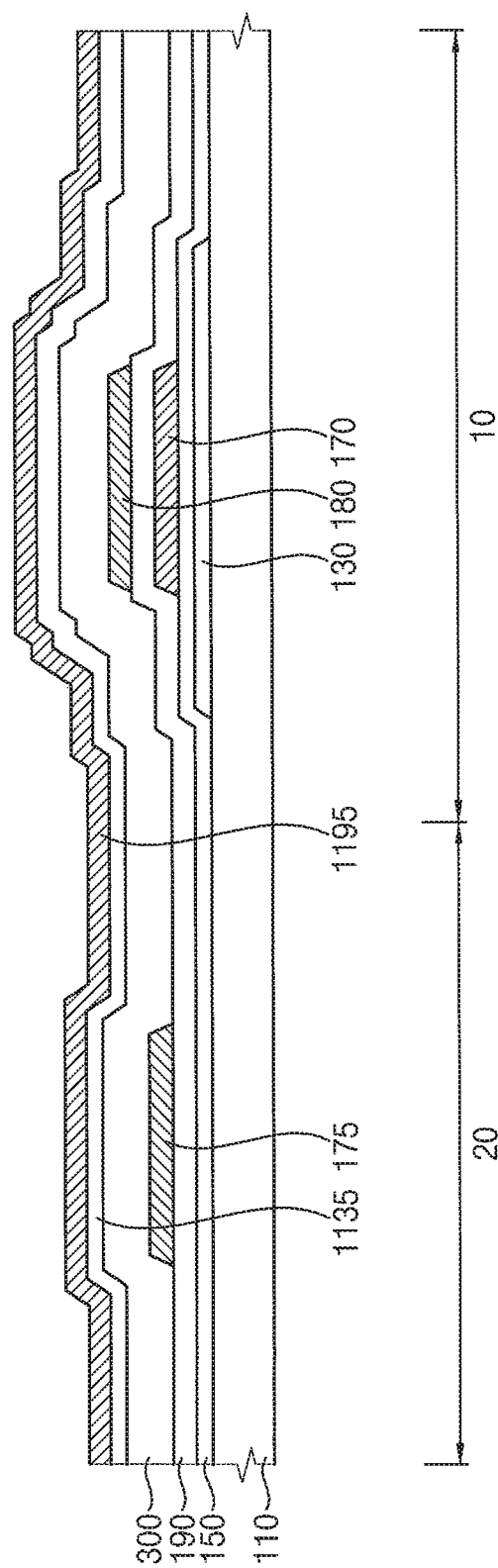

Referring to FIG. 4, a preliminary second active layer 1135 may be formed in the first and second regions 10 and 20 on the entire second insulating interlayer 300. For example, the preliminary second active layer 1135 may be formed as a substantially uniform thickness along a profile of the second insulating interlayer 300. The preliminary second active layer 1135 may be formed using a metal oxide semiconductor. In other words, the preliminary second active layer 1135 may include a metal oxide semiconductor layer including at least one of ABx, ABxCy, ABxCyDz, etc. These compounds contain In, Zn, Ga, Sn, Ti, Al, Hf, Zr, Mg, etc. For example, the preliminary second active layer 1135 may include at least one of ZnOx, GaOx, TiOx, SnOx, InOx, IGO, IZO, ITO, GZO, ZMO, ZTO, ZnZrxOy, IGZO, IZTO, IGHO, TAZO, IGTO, etc.

A preliminary protection electrode layer 1195 may be formed in the first and second regions 10 and 20 on the entire preliminary second active layer 1135. For example, the preliminary protection electrode layer 1195 may be formed as a substantially uniform thickness along a profile of the preliminary second active layer 1135. The preliminary protection electrode layer 1195 may be formed using a conductive layer such as a metal, an alloy of a metal, metal nitride, conductive metal oxide, transparent conductive materials, etc. For example, the preliminary protection electrode layer 1195 may include Au, Ag, Al, W, Cu, Pt, Ni, Ti, Pd, Mg, Ca, Li, Cr, Ta, Mo, Sc, Nd, Jr, an alloy of aluminum, AlNx, an alloy of silver, WNx, an alloy of copper, an alloy of molybdenum, TiNx, CrNx, TaNx, SRO, ZnOx, ITO, SnOx, InOx, GaOx, IZO, etc. These may be used alone or in a suitable combination thereof. Alternatively, the preliminary protection electrode layer 1195 may have a multi-layered structure including a plurality of layers. In example embodiments, the preliminary protection electrode layer 1195 may include materials that are not etched by an etchant used in the BOE process, which will be described below, so as to protect the preliminary second active layer 1135 from the etchant used in the BOE process. For example, the preliminary protection electrode layer 1195 may include Mo or Cu.

Figure 5:
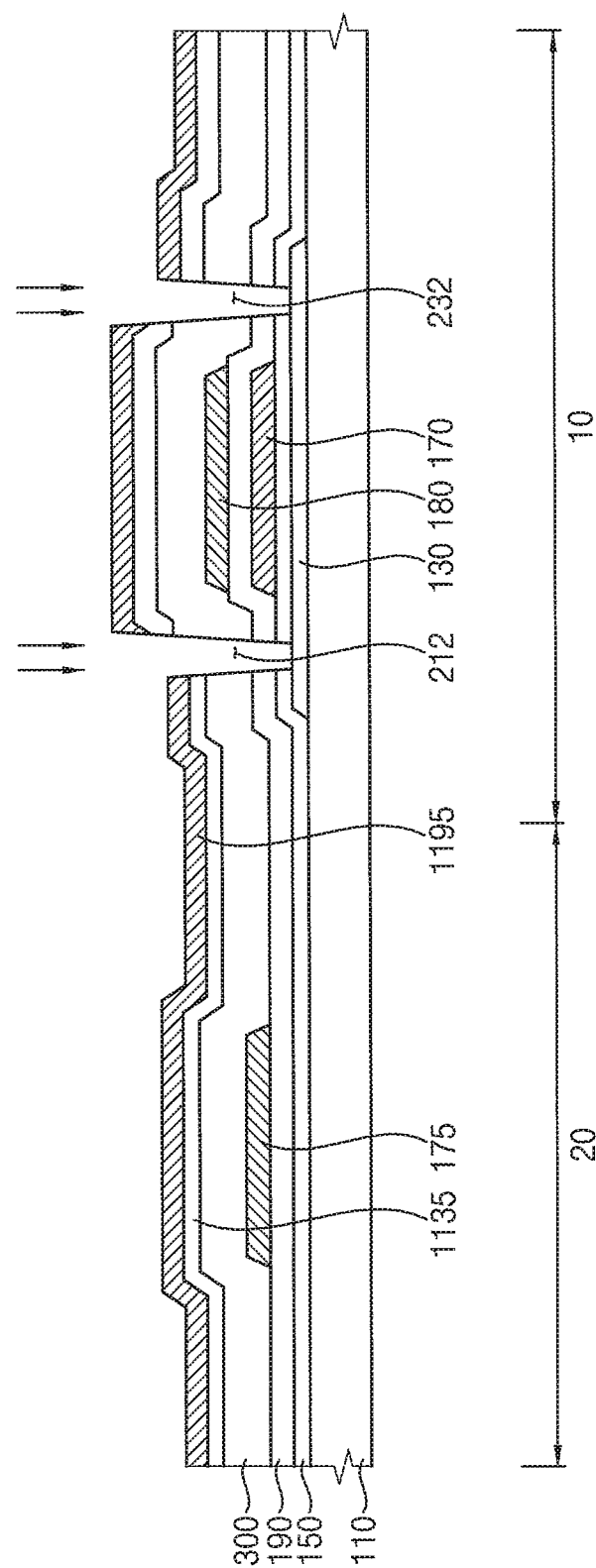

Referring to FIG. 5, a first contact hole 212 may be formed by removing a first portion of the preliminary second active layer 1135, the preliminary protection electrode layer 1195, the second insulating interlayer 300, the first insulating interlayer 190, and the gate insulation layer 150 in the first region 10. The first contact hole 212 may expose the source region of the first active layer 130. In addition, a second contact hole 232 may be formed by removing a second portion of the preliminary second active layer 1135, the preliminary protection electrode layer 1195, the second insulating interlayer 300, the first insulating interlayer 190, and the gate insulation layer 150 in the first region 10. The second contact hole 232 may expose the drain region of the first active layer 130. The first and second portions of the preliminary second active layer 1135, the preliminary protection electrode layer 1195, the second insulating interlayer 300, the first insulating interlayer 190, and the gate insulation layer 150 may be removed through oxygen plasma treatment process.

Figure 6:
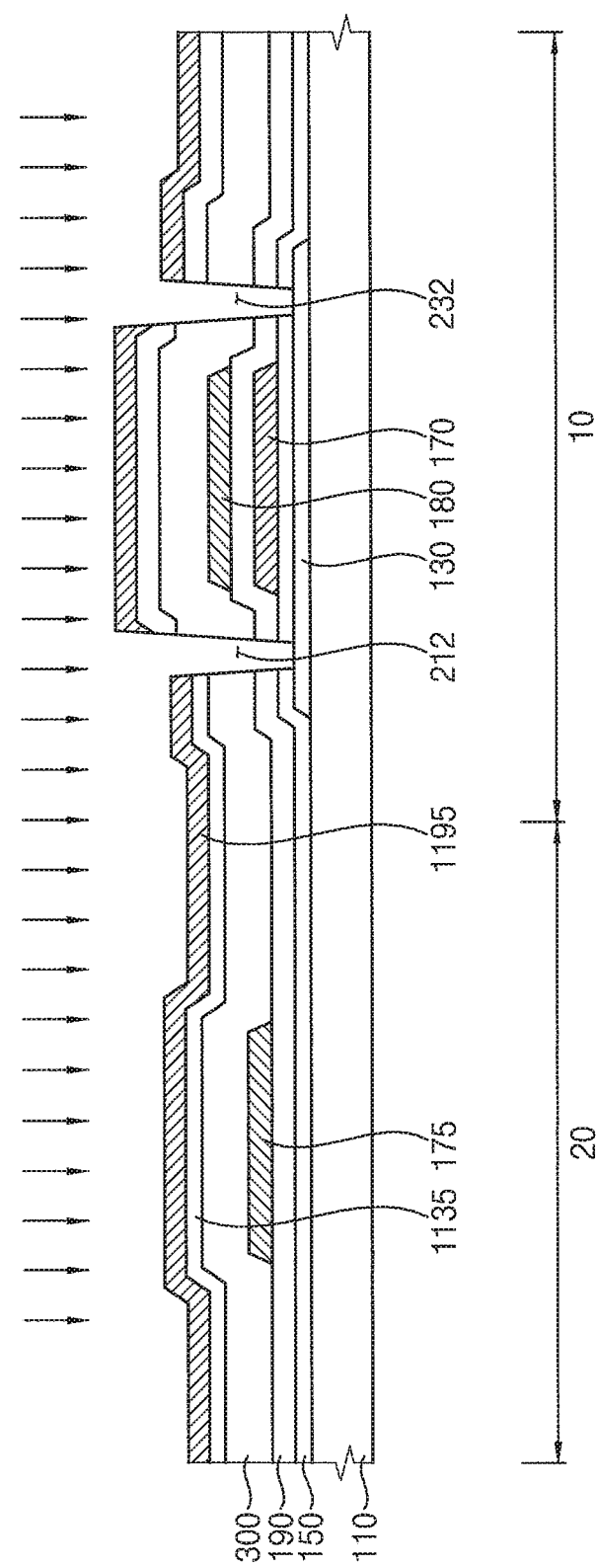

Referring to FIG. 6, a heat treatment process may be performed on the entire substrate 110. In example embodiments, when the heat treatment process is performed on the first active layer 130, a driving-range of a first semiconductor element 250, which will be described below, that corresponds to a driving transistor may be relatively widened. In addition, when the heat treatment process is performed on the preliminary second active layer 1135, a second semiconductor element 255 that is relatively precise may be obtained because a scattering of a threshold voltage of the second semiconductor element 255, which will be described below, that corresponds to a switching transistor is reduced. As the heat treatment process is simultaneously performed on the first active layer 130 and the preliminary second active layer 1135, a manufacturing cost of an OLED device may be relatively decreased.

In the heat treatment process, an oxide layer (or oxides) may be formed in the source and drain regions of the first active layer 130. For example, because the heat treatment process is performed in an atmosphere in which oxygen ions exist in a chamber, an upper surface of the first active layer 130 exposed to an outside through the first contact hole 212 and the second contact hole 232 may be reacted with the oxygen ions, thus the oxide layer may be formed on a surface of the exposed first active layer 130.

After the heat treatment process, to remove the oxide layer formed on the first active layer 130, an etching process using the BOE, the BOE process, may be performed. During the BOE process, because the preliminary protection electrode layer 1195 completely cover the preliminary second active layer 1135, the preliminary protection electrode layer 1195 may protect the preliminary second active layer 1135 from damaging by the etchant used in the BOE process. Accordingly, the BOE process may be performed without a damage of the preliminary second active layer 1135.

Figure 7:
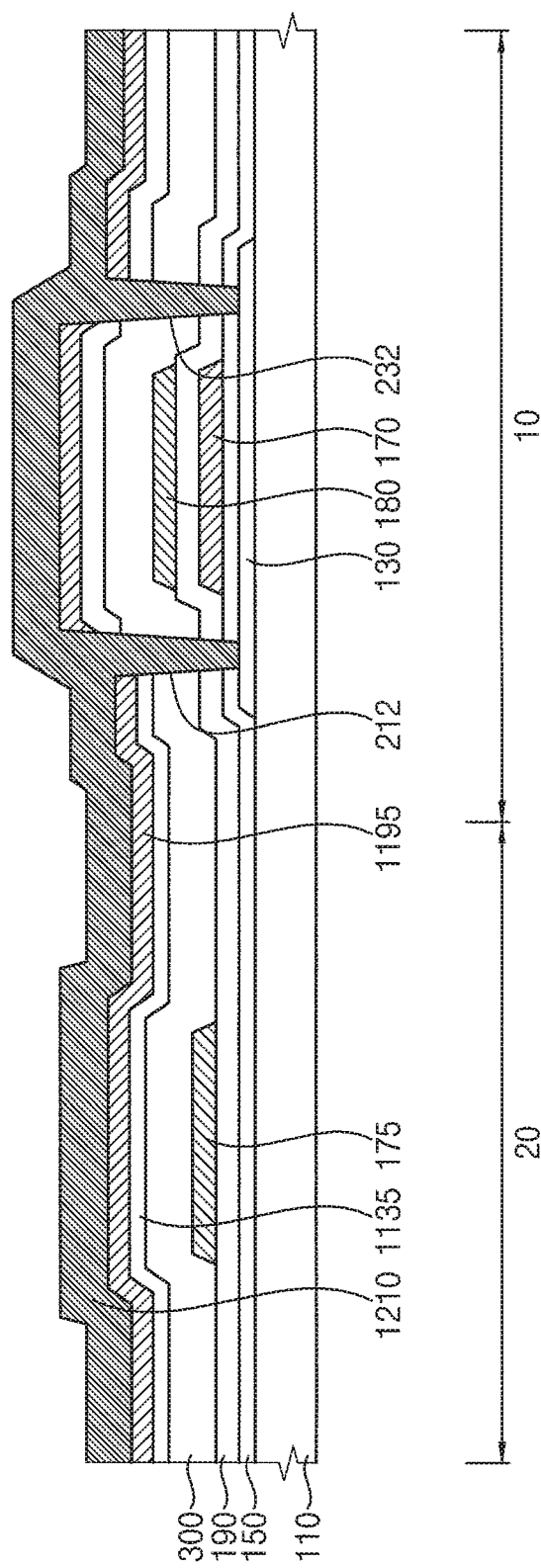

Referring to FIG. 7, a preliminary electrode layer 1210 may be formed in the first and second regions 10 and 20 on the entire preliminary protection electrode layer 1195. For example, the preliminary electrode layer 1210 may be formed as a substantially uniform thickness along a profile of the preliminary protection electrode layer 1195. The preliminary electrode layer 1210 may be formed using a metal, an alloy, metal nitride, conductive metal oxide, transparent conductive materials, etc. These may be used alone or in a suitable combination thereof. Alternatively, the preliminary electrode layer 1210 may have a multi-layered structure including a plurality of layers. After the preliminary electrode layer 1210 is formed, a selective etch process may be performed using a half tone mask.

Figure 8:
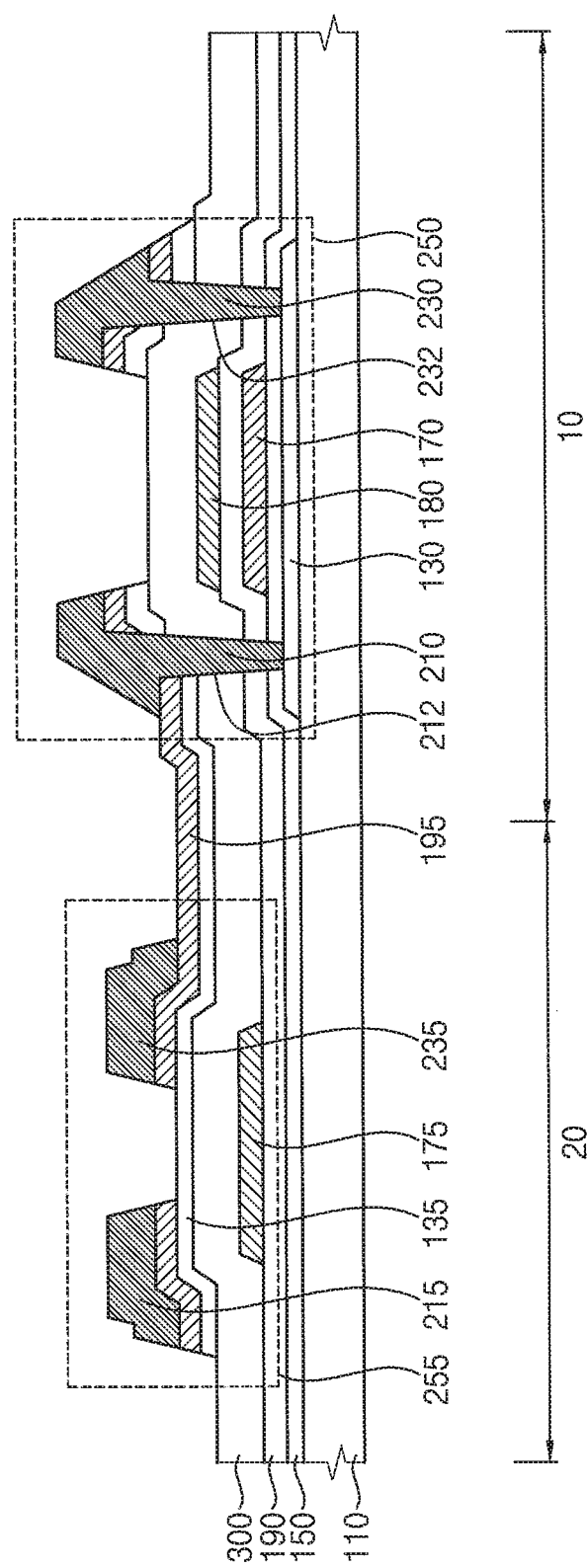

Referring to FIG. 8, by selectively etching the preliminary second active layer 1135, the preliminary protection electrode layer 1195, and the preliminary electrode layer 1210, a first source electrode 210 and a first drain electrode 230 may be formed in the first region 10 on the 300 on the second insulating interlayer 300, and a second active layer 135, a protection electrode 195, a second source electrode 215, and a second drain electrode 235 may be formed in the second region 20 on the second insulating interlayer 300.

For example, by using the selective etch process through the half tone mask, the second active layer 135 may be formed in a space disposed between the second source electrode 215 and the second drain electrode 235, and might not be formed in a space disposed between the first source electrode 210 and the first drain electrode 230. In other words, the preliminary electrode layer 1210 and the preliminary protection electrode layer 1195 disposed between the second source electrode 215 and the second drain electrode 235 may be removed, thus the second active layer 135 disposed between the second source electrode 215 and the second drain electrode 235 may be exposed. The second active layer 135 may be removed in a space disposed between the second drain electrode 235 and the first source electrode 210. In addition, the protection electrode 195 disposed between the second source electrode 215 and the second drain electrode 235 may be removed, and the protection electrode 195 disposed between the first source electrode 210 and the first drain electrode 230 may be removed. In other words, a first opening of the protection electrode 195 may be formed by removing the preliminary protection electrode layer 1195 and the preliminary electrode layer 1210 that are located in the space disposed between the second source electrode 215 and the second drain electrode 235 in the second region 20, and a second opening may be formed by removing the preliminary second active layer 1135, the preliminary protection electrode layer 1195, and the preliminary electrode layer 1210 that are located in the space disposed between the first source electrode 210 and the first drain electrode 230 in first region 10. The protection electrode 195 may not be removed in a space disposed between the second drain electrode 235 and the first source electrode 210. Further, the second insulating interlayer 300 disposed between the first source electrode 210 and the first drain electrode 230 may be exposed, and the second insulating interlayer 300 disposed between the second drain electrode 235 and the first source electrode 210 may be covered by the second active layer 135 and the protection electrode 195. In other words, by removing the preliminary electrode layer 1210 disposed between the second drain electrode 235 and the first source electrode 210, the second insulating interlayer 300 may be covered by the second active layer 135 and the protection electrode 195.

Accordingly, the first semiconductor element 250 including the first active layer 130, the first gate electrode 170, the first source electrode 210, and the first drain electrode 230 may be formed, and the second semiconductor element 255 including the second active layer 135, the second gate electrode 175, the second source electrode 215, and the second drain electrode 235 may be formed.

Figure 9:
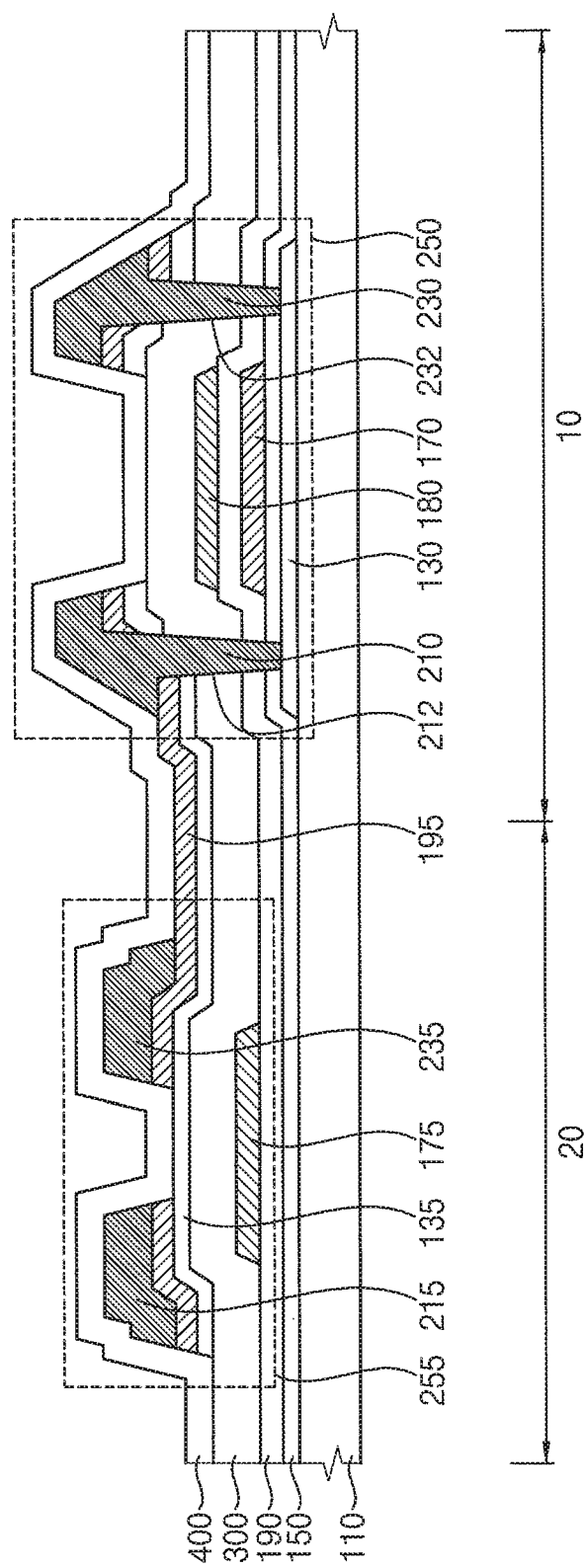

Referring to FIG. 9, a protective insulation layer 400 may be formed on the second insulating interlayer 300, the first source and first drain electrodes 210 and 230, and the second source and second drain electrodes 215 and 235. The protective insulation layer 400 may cover the first source and first drain electrodes 210 and 230 in the first region 10 and the second source and second drain electrodes 215 and 235 in the second region 20 on the second insulating interlayer 300, and may be formed on the entire second insulating interlayer 300. For example, the protective insulation layer 400 may cover the first source and first drain electrodes 210 and 230 and the second source and second drain electrodes 215 and 235 on the second insulating interlayer 300, and may be formed as a substantially uniform thickness along a profile of the first source and first drain electrodes 210 and 230 and the second source and second drain electrodes 215 and 235. Alternatively, the protective insulation layer 400 may sufficiently cover the first source and first drain electrodes 210 and 230 and the second source and second drain electrodes 215 and 235 on the second insulating interlayer 300, and may have a substantially flat upper surface without a step around the first source and first drain electrodes 210 and 230 and the second source and second drain electrodes 215 and 235. The protective insulation layer 400 may be formed using silicon compound, metal oxide, etc. In example embodiments, the protective insulation layer 400 may include SiOx. In addition, the protective insulation layer 400 may be in direct contact with an upper surface of the second active layer 135 and side walls of the protection electrode 195 in a space (e.g., the first opening of the protection electrode 195) disposed between the second source electrode 215 and the second drain electrode 235. Further, the protective insulation layer 400 disposed in a space (e.g., the second opening of the protection electrode 195) between the first source electrode 210 and the first drain electrode 230 may be in direct contact with an upper surface of the second insulating interlayer 300, side walls of the second active layer 135, and side walls of the protection electrode 195. Alternatively, the protective insulation layer 400 may have a multi-layered structure including a plurality of insulation layers. For example, the insulation layers may have different thicknesses to each other or include different materials to each other.

Figure 10:
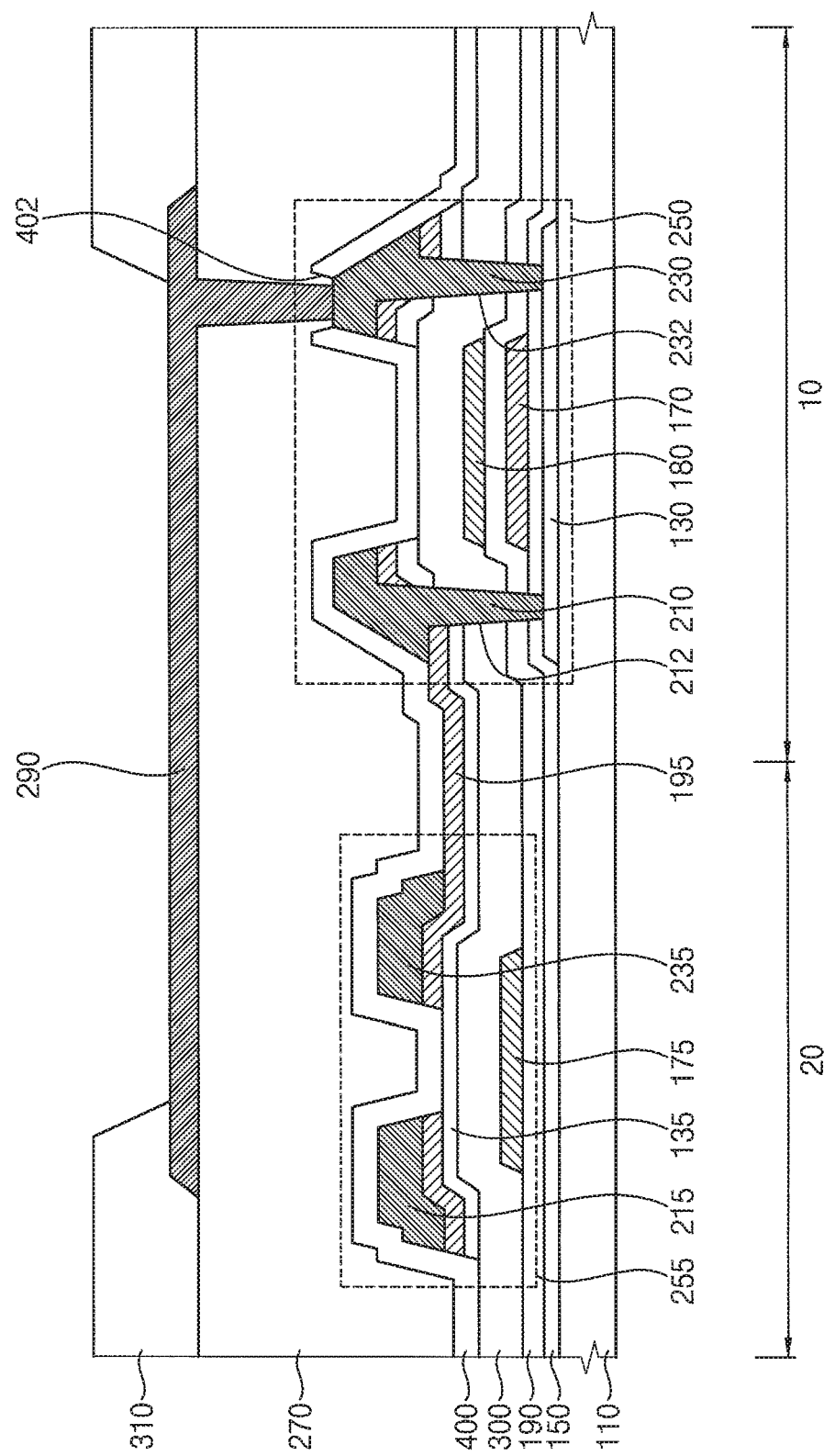

Referring to FIG. 10, an opening 402 exposing a portion of an upper surface of the first drain electrode 230 may be formed in the first region 10. A planarization layer 270 may be formed on the protective insulation layer 400. The planarization layer 270 may be formed on the entire protective insulation layer 400. For example, the planarization layer 270 may be formed as a thickness enough to sufficiently cover the protective insulation layer 400. In this case, the planarization layer 270 may have a substantially flat upper surface. A planarization process may be further performed on the planarization layer 270 to implement the flat upper surface of the planarization layer 270 if the surface of the planarization layer 270 is not flat. The portion of the upper surface of the first drain electrode 230 may be exposed via a contact hole formed by removing a portion of the planarization layer 270. The planarization layer 270 may be formed organic materials such as polyimide, epoxy-based resin, acryl-based resin, polyester, photoresist, polyacryl-based resin, polyimide-based resin, a polyamide-based resin, a siloxane-based resin, etc. For example, since the protective insulation layer 400 includes inorganic materials and the planarization layer 270 includes organic materials, the protective insulation layer 400 might not be removed in an etching process for forming the contact hole of the planarization layer 270. Thus, to expose the portion of the upper surface of the first drain electrode 230, the contact hole of the planarization layer 270 may be formed after the opening 402 of the protective insulation layer 400 is formed.

A lower electrode 290 may be formed on the planarization layer 270. The lower electrode 290 may be in direct contact with the first drain electrode 230 via the contact hole in the planarization layer 270. The lower electrode 290 may be formed using a metal, a metal alloy, metal nitride, conductive metal oxide, transparent conductive materials, etc. These may be used alone or in a suitable combination thereof. Alternatively, the lower electrode 290 may have a multi-layered structure including a plurality of layers.

A pixel defining layer 310 may be formed on a portion of the lower electrode 290 and the planarization layer 270. The pixel defining layer 310 may cover entire edges of the lower electrode 290 including both lateral portions of the lower electrode 290, and may expose a portion of an upper surface of the lower electrode 290. The pixel defining layer 310 may be formed using organic materials.

Referring to FIG. 1, a light emitting layer 330 may be formed on the lower electrode 290 exposed by the pixel defining layer 310. The light emitting layer 330 may be formed using at least one of light emitting materials capable of generating different colors of light, e.g., a red color of light, a blue color of light, and a green color of light, etc., according to sub-pixels. Alternatively, the light emitting layer 330 may generally generate a white color of light by stacking a plurality of light emitting materials capable of generating different colors of light such as a red color of light, a green color of light, a blue color of light, etc. In this case, a color filter may be formed on the light emitting layer 330, e.g., to overlap the light emitting layer 330 on a lower surface of an encapsulation substrate (not shown). The color filter may include at least one selected from a red color filter, a green color filter, and a blue color filter. Alternatively, the color filter may include a yellow color filter, a cyan color filter, and a magenta color filter. The color filter may be formed using a photosensitive resin, a color photoresist, etc.

An upper electrode 340 may be formed on the pixel defining layer 310 and the light emitting layer 330. The upper electrode 340 may cover the light emitting layer 330 and the pixel defining layer 310, and may be entirely formed on the light emitting layer 330 and the pixel defining layer 310. The upper electrode 340 may be formed using a metal, a metal alloy, metal nitride, conductive metal oxide, transparent conductive materials, etc. These may be used alone or in a suitable combination thereof. Alternatively, the upper electrode 340 may have a multi-layered structure including a plurality of layers.

Accordingly, a light emitting structure 200 including the lower electrode 290, the light emitting layer 330, and the upper electrode 340 may be formed.

An encapsulation substrate (not shown) may be formed on the upper electrode 340. The encapsulation substrate and the substrate 110 may include substantially the same materials. For example, the encapsulation substrate may include a quartz substrate, a synthetic quartz substrate, a calcium fluoride substrate, a fluoride-doped quartz substrate, a sodalime glass substrate, a non-alkali glass substrate, etc. In some example embodiments, the encapsulation substrate may include a transparent inorganic material or flexible plastic. For example, the encapsulation substrate may include a flexible transparent resin substrate. In this case, to increase flexibility of an OLED device, the encapsulation substrate may have a stacked structure where at least one inorganic layer and at least one organic layer are alternately stacked. The stack structure may include a first inorganic layer, an organic layer, and a second inorganic layer. For example, the first inorganic layer having flexibility may be formed along a profile of the upper electrode 340, and the organic layer having flexibility may be formed on the first inorganic layer. The second inorganic layer having flexibility may be formed on the organic layer. That is, the stack structure may correspond to a thin film encapsulation structure that is in direct contact with the upper electrode 340.

Accordingly, an OLED device 100 illustrated in FIG. 1 may be manufactured.

In a method of manufacturing the OLED device 100 in accordance with example embodiments, when the heat treatment process is performed on the first active layer 130 and the preliminary second active layer 1135, a driving-range of the first semiconductor element 250 that corresponds to a driving transistor may be relatively widened, and the second semiconductor element 255 that is relatively precise may be obtained because a scattering of a threshold voltage of the second semiconductor element 255 that corresponds to a switching transistor is reduced. In addition, as the heat treatment process is simultaneously performed on the first active layer 130 and the preliminary second active layer 1135, a manufacturing cost of the OLED device 100 may be relatively decreased.

In addition, since the preliminary protection electrode layer 1195 completely cover the preliminary second active layer 1135, the preliminary protection electrode layer 1195 may protect the preliminary second active layer 1135 from damaging by the etchant used in the BOE process. Accordingly, after the preliminary second active layer 1135 is formed, the BOE process may be performed without a damage of the preliminary second active layer 1135.

Figure 11:
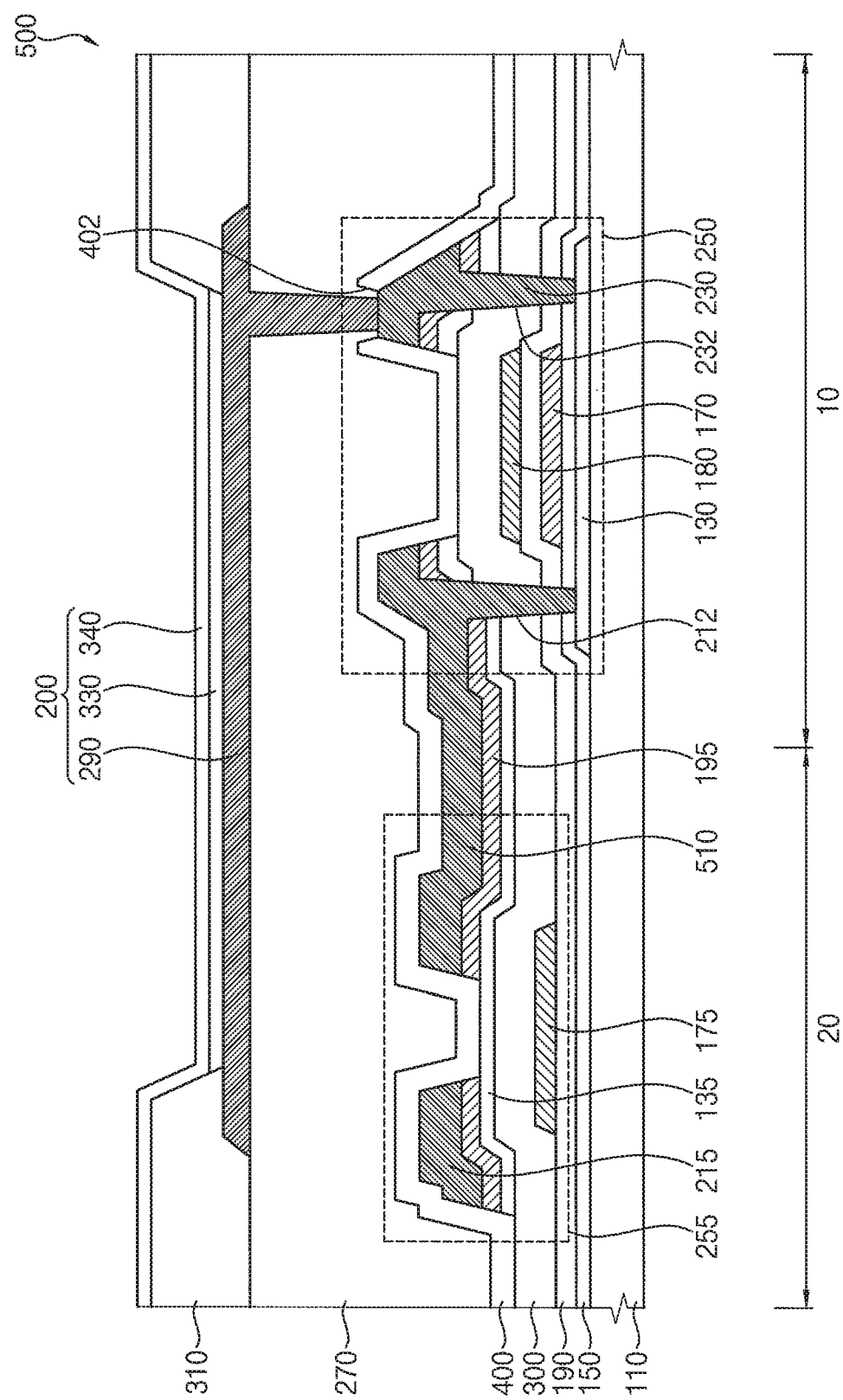
FIG. 11 is a cross-sectional view illustrating an OLED device in accordance with example embodiments.

FIG. 11 is a cross-sectional view illustrating an OLED device in accordance with example embodiments. An OLED display device 500 illustrated in FIG. 11 may have a configuration substantially the same as or similar to that of an OLED display device 100 described with reference to FIG. 1 except for a connection electrode 510. In FIG. 11, detailed descriptions for elements that are substantially the same as or similar to elements described with reference to FIG. 1 may not be repeated.

Referring to FIG. 11, an OLED device 500 may include a substrate 110, a first semiconductor element 250, a second semiconductor element 255, a gate electrode pattern 180, a gate insulation layer 150, a first insulating interlayer 190, a second insulating interlayer 300, a protection electrode 195, a protective insulation layer 400, a planarization layer 270, a light emitting structure 200, a pixel defining layer 310, etc.

In example embodiments, a connection electrode 510 may correspond to a source electrode of the first semiconductor element 250 and a drain electrode of the second semiconductor element 255. In other words, the source electrode of the first semiconductor element 250 and the drain electrode of the second semiconductor element 255 may be integrally formed.

Figure 12:
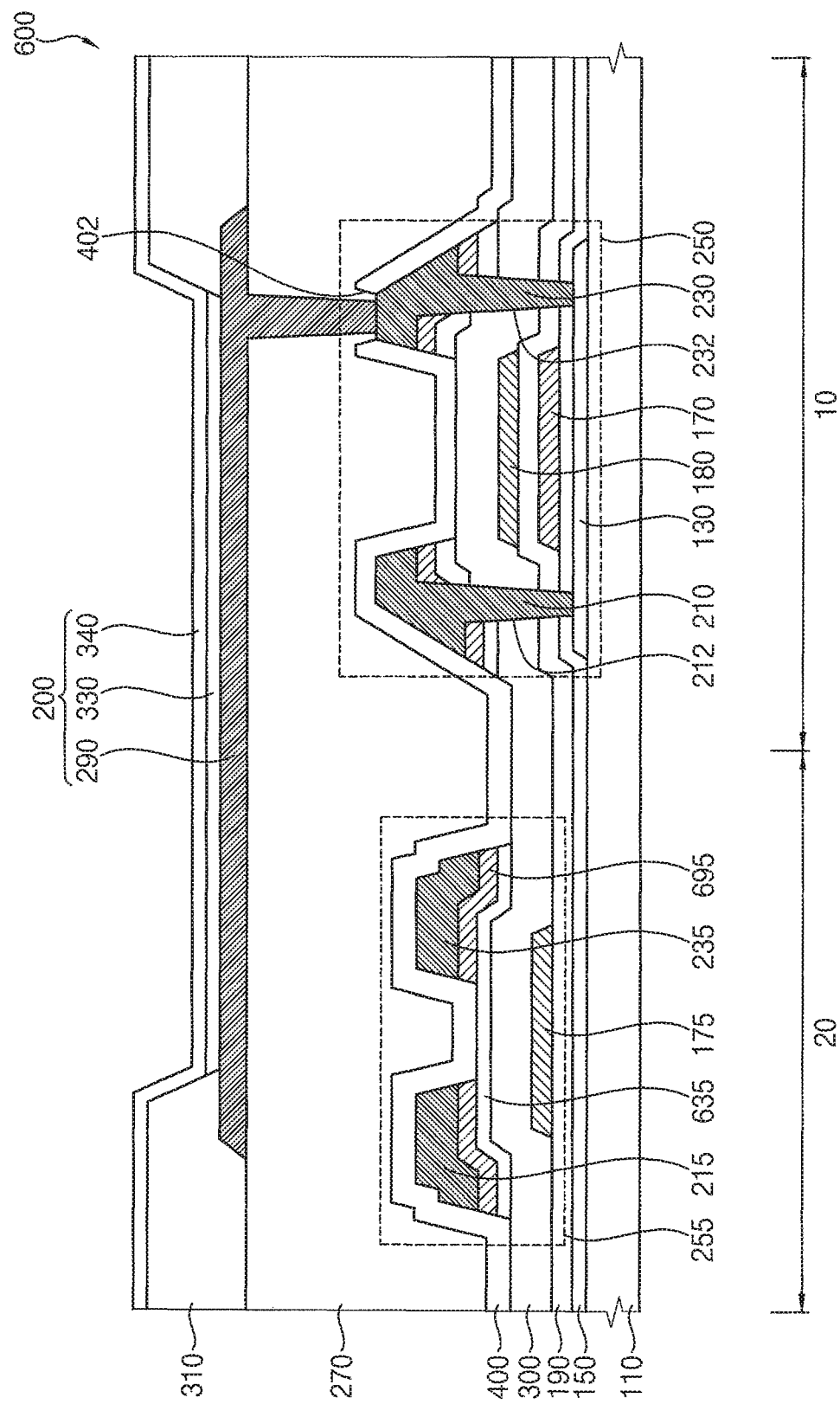
FIG. 12 is a cross-sectional view illustrating an OLED device in accordance with example embodiments.

FIG. 12 is a cross-sectional view illustrating an OLED device in accordance with example embodiments. An OLED display device 600 illustrated in FIG. 11 may have a configuration substantially the same as or similar to that of an OLED display device 100 described with reference to FIG. 1 except for a second active layer 635 and a protection electrode 695. In FIG. 12, detailed descriptions for elements that are substantially the same as or similar to elements described with reference to FIG. 1 may not be repeated.

Referring to FIG. 12, the OLED device 600 may include a substrate 110, a first semiconductor element 250, a second semiconductor element 255, a gate electrode pattern 180, a gate insulation layer 150, a first insulating interlayer 190, a second insulating interlayer 300, a protection electrode 695, a protective insulation layer 400, a planarization layer 270, a light emitting structure 200, a pixel defining layer 310, etc. Here, the first semiconductor element 250 may include a first active layer 130, a first gate electrode 170, a first source electrode 210, and a first drain electrode 230, and the second semiconductor element 255 may include a second active layer 635, a second gate electrode 175, a second source electrode 215, and a second drain electrode 235. In addition, the light emitting structure 200 may include a lower electrode 290, a light emitting layer 330, and an upper electrode 340.

The second active layer 635 may be disposed to overlap the protection electrode 695, the first source electrode 210, the first drain electrode 230, the second source electrode 215, and the second drain electrode 235, may not disposed in a contact hole 212 and a contact hole 232. In addition, the second active layer 635 may be disposed in a space disposed between the second source electrode 215 and the second drain electrode 235, and might not be disposed between the first source electrode 210 and the first drain electrode 230. Further, the second active layer 635 might not be disposed in a space between the second drain electrode 235 and the first source electrode 210.

The protection electrode 695 may be disposed to overlap the second active layer 635, the first source electrode 210, the first drain electrode 230, the second source electrode 215, and the second drain electrode 235, and may not disposed in the contact hole 212 and the contact hole 232. In addition, the protection electrode 695 might not be disposed in a space between the second source electrode 215 and the second drain electrode 235, and might not be disposed in a space between the first source electrode 210 and the first drain electrode 230. The protection electrode 695 might not be disposed in a space between the second drain electrode 235 and the first source electrode 210. In other words, the protection electrode 695 may have a first opening exposing an upper surface of the second active layer 635 in the second region 20, a second opening exposing an upper surface of the second insulating interlayer 300 in the first region 10, and a third opening exposing an upper surface of the second insulating interlayer 300 in a boundary between the first region 10 and the second region 20. That is, as the second active layer 635 and the protection electrode 695 might not be disposed in a space between the second drain electrode 235 and the first source electrode 210, the first semiconductor element 250 may be spaced apart from the second semiconductor element 255. Thus, the first semiconductor element 250 and the second semiconductor element 255 may be independently driven to each other.

The inventive concept may be applied to various display devices including an OLED device. For example, the inventive concept may be applied to vehicle-display device, a ship-display device, an aircraft-display device, portable communication devices, display devices for display or for information transfer, a medical-display device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and features of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting display (OLED) device comprising:
    a substrate having a first region and a second region that is adjacent to the first region;
    a first semiconductor element including:
        a first active layer disposed in the first region on the substrate;
        a first gate electrode disposed on the first active layer; and
        a first source electrode and a first drain electrode disposed on the first gate electrode;
    a second semiconductor element including:
        a second gate electrode disposed in the second region on the substrate;
        a second active layer disposed on the second gate electrode; and
        a second source electrode and a second drain electrode disposed on the second active layer;
    a protection electrode disposed between the second active layer and the second source electrode and the second drain electrode, the protection electrode having an opening that exposes a portion of the second active layer; and
    a light emitting structure disposed on the first semiconductor element and the second semiconductor element,
    wherein the protection electrode is disposed between the second drain electrode and the second active layer to overlap the second drain electrode and the second active layer in a cross sectional view, and between the first source electrode and the second active layer to overlap the first source electrode and the second active layer in a plan view such that the protection electrode electrically connects the first source electrode and the second drain electrode, and is not in direct contact with the first active layer.

2. The OLED device of claim 1, wherein the second active layer is located to overlap the first source electrode, the first drain electrode, the second source electrode, and the second drain electrode.

3. The OLED device of claim 1, wherein the second active layer is disposed under the protection electrode to overlap a portion of the protection electrode.

4. The OLED device of claim 1, wherein the protection electrode is in contact with a lower surface of the first source electrode and a lower surface of the second drain electrode, and is disposed in a space disposed between the first source electrode and the second drain electrode.

5. The OLED device of claim 1, wherein the second active layer is not disposed in a space disposed between the first source electrode and the first drain electrode, and is disposed in a space disposed between the first source electrode and the second drain electrode and in a space disposed between the second source electrode and the second drain electrode.

6. The OLED device of claim 1, wherein the protection electrode is not disposed in both a space disposed between the first source electrode and the first drain electrode and a space disposed between the second source electrode and the second drain electrode, and
    wherein a space disposed between the second source electrode and the second drain electrode corresponds to the opening of the protection electrode.

7. The OLED device of claim 1, wherein the first semiconductor element has a top gate structure and includes a silicon-based semiconductor, and wherein the second semiconductor element has a bottom gate structure and includes a metal oxide-based semiconductor.

8. The OLED device of claim 7, wherein the first active layer of the first semiconductor element includes amorphous silicon or polysilicon.

9. The OLED device of claim 1, further comprising:

a gate electrode pattern disposed on the first gate electrode, wherein the gate electrode pattern and the second gate electrode are located on a same layer.

10. The OLED device of claim 1, further comprising:

a gate insulation layer covering the first active layer in the first region on the substrate;

a first insulating interlayer covering the first gate electrode in the first region on the gate insulation layer;

a second insulating interlayer covering the second gate electrode in the second region on the first insulating interlayer; and a protecting insulation layer covering the first source electrode, the first drain electrode, the second source electrode and the second drain electrode on the second insulating interlayer and having an opening that exposes a portion of the first drain electrode.

11. The OLED device of claim 10, wherein the protective insulation layer is in contact with an upper surface of the second active layer and side walls of the protection electrode in a space disposed between the second source electrode and the second drain electrode.

12. The OLED device of claim 10, wherein the protective insulation layer is in contact with an upper surface of the second insulating interlayer, side walls of the second active layer, and side walls of the protection electrode in a space disposed between the first source electrode and the first drain electrode.

13. The OLED device of claim 10, wherein the second insulating interlayer is in contact with a lower surface of the second active layer, and the second insulating interlayer and the protective insulation layer include silicon oxide.

14. The OLED device of claim 13, wherein the light emitting structure includes:

a lower electrode disposed on the first semiconductor element and the second semiconductor element;

a light emitting layer disposed on the lower electrode; and an upper electrode disposed on the light emitting layer.

15. The OLED device of claim 14, further comprising:

a planarization layer disposed between the protective insulation layer and the lower electrode, the planarization layer including organic materials, wherein the planarization layer has a contact hole exposing an upper surface of the first drain electrode exposed by the opening of the protective insulation layer, and the lower electrode is connected to the first drain electrode through the contact hole of the planarization layer.

* * * * *